(12) United States Patent
Liu et al.

(10) Patent No.: US 7,663,196 B2
(45) Date of Patent: Feb. 16, 2010

(54) INTEGRATED PASSIVE DEVICE AND METHOD OF FABRICATION

(75) Inventors: Lianjun Liu, Chandler, AZ (US); Melvy F. Miller, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 393 days.

(21) Appl. No.: 11/673,015

(22) Filed: Feb. 9, 2007

(65) Prior Publication Data

US 2008/0191293 A1 Aug. 14, 2008

(51) Int. Cl.
*H01L 27/14* (2006.01)
*H01L 29/82* (2006.01)
*H01L 29/84* (2006.01)
*H01L 29/00* (2006.01)

(52) U.S. Cl. .......... 257/416; 257/414; 257/533; 257/E27.025; 257/E29.324; 257/E31.113

(58) Field of Classification Search .......... 438/106; 257/140, 170, 176, 180, 188, 300, 704, 414, 257/416, 533, E21.001, E27.025, E29.324, 257/E31.113
See application file for complete search history.

(56) References Cited

U.S. PATENT DOCUMENTS

| | | | |
|---|---|---|---|
| 6,307,169 B1 | 10/2001 | Sun et al. | |
| 6,307,452 B1 | 10/2001 | Sun | |
| 6,384,353 B1 | 5/2002 | Huang et al. | |
| 6,507,475 B1 | 1/2003 | Sun | |
| 6,706,548 B2 | 3/2004 | Liu | |
| 6,777,263 B1 | 8/2004 | Gan et al. | |
| 6,794,101 B2 | 9/2004 | Liu et al. | |
| 6,858,892 B2 * | 2/2005 | Yamagata | 257/300 |
| 6,872,902 B2 * | 3/2005 | Cohn et al. | 200/181 |

* cited by examiner

*Primary Examiner*—David S Blum
(74) *Attorney, Agent, or Firm*—Meschkow & Gresham, PLC (57) ABSTRACT

A device 20 includes substrates 22 and 24 coupled to form a volume 32 between the substrates. A surface 28 of the substrate 22 faces a surface 30 of the substrate 24. A metal-insulator-metal capacitor 34 is formed on one of the surfaces 28 and 30. A conductive element 58 spans between a top electrode 56 of the capacitor 34 and the other surface 28 and 30. Vias 64 and 66 extend through the substrate 22 and are electrically interconnected with the conductive element 58 and a bottom electrode 52 of the capacitor 34. Another device 72 includes an underpass transmission line 92 formed on a surface 80 of a substrate 74 within a volume 84 formed between the substrate 74 and another substrate 76. The line 92 underlies an integrated device 96 formed on a surface 78 of the substrate 74.

15 Claims, 3 Drawing Sheets

INTEGRATED PASSIVE DEVICE AND METHOD OF FABRICATION

TECHNICAL FIELD OF THE INVENTION

The present invention relates generally to electronic devices. More specifically, the present invention relates to electronic devices fabricated using integrated passive device (IPD) technology.

BACKGROUND OF THE INVENTION

The explosion of growth in the portable wireless electronics industry has provided numerous challenges and opportunities for manufacturers of integrated circuits. The latest portable wireless telephony, data, and Internet access products demand greater functionality, higher performance, and lower cost in smaller and lighter formats. Additionally, wireless applications are spreading to new markets—from radar-equipped passenger vehicles to biomedical devices that, when injected or inserted, send data to a receiver outside the body. This demand has been satisfied in part by major advances in integrated circuit (IC) device technology and by the introduction of smaller packaging form factors, smaller discrete passive components, and high-density integrated circuit technologies. As more and more components are designed into an integrated circuit, the complexity of the integrated circuit is increased, thereby enabling greater functionality in the circuit. Moreover, functions that were once performed by multiple integrated circuits can often be integrated together onto the same integrated circuit, thereby reducing costs, power consumption, and size, while improving speed and interconnectivity.

Passive components such as capacitors, inductors, resistors, and other types of passive devices are increasingly incorporated into integrated circuits, thereby eliminating the need to include separate, discrete components in a circuit design that would otherwise increase circuit size, power consumption, and cost. However, the demands of smaller circuit design rules and the desire to incorporate various passive circuit components in an integrated circuit have demanded new materials, new structures and new processing techniques to be incorporated into the integrated circuit fabrication process. Integrated passive device technologies in which multiple passive devices share a substrate and packaging hold great potential for significantly reducing circuit board area and product size and weight and/or for allowing increased functionality at a given product size.

One type of passive device that is increasingly incorporated into many integrated circuit designs is a metal-insulator-metal (MIM) capacitor. A MIM capacitor typically comprises a stacked arrangement of materials that includes, in the least, top and bottom conductive electrodes incorporating a conductive material, and an intermediate insulator layer incorporating a dielectric material. MIM capacitors are often utilized, for example, in high frequency (e.g., RF) telecommunications applications such as in cell phones and other wireless devices, as well as other telecommunications products.

As the size of integrated circuits continues to shrink, conducting structures and leads fabricated within those circuits must be positioned in closer proximity to each other both horizontally and vertically. This introduces the problem of increased capacitive coupling between those structures and leads, which produces time delays and creates cross-talk between the wiring elements. RC (resistance-capacitance resonant) losses in the wiring levels of integrated circuits make significant contributions limiting the performance of the final semiconductor product. One way to reduce the capacitive coupling and RC losses is to lower the dielectric constant of the material that is used to separate the conducting leads and structures from each other. Other attempts to reduce the dielectric constant have produced methods that introduce air into the gap-filling dielectric material or totally replace the gap-filling material with air. While the use of particular materials or air voids can effectively reduce coupling and RC losses, such structures can increase fabrication complexity, and commensurately, fabrication costs of such integrated circuits.

Micro electro-mechanical systems (MEMS) components include microfabricated mechanical systems, such as switches, sensors, gyroscopes, and so forth, on a semiconductor chip. In general, MEMS technology is directed to the integration of mechanical elements, sensors, actuators, and electronics on a common substrate through the utilization of microfabrication technology. While associated electronics are fabricated using integrated circuit (IC) process sequences, the micromechanical components are fabricated using compatible micromachining processes that selectively etch away parts of a substrate, such as a silicon wafer or add new structural layers (e.g., by deposition), to form the mechanical and electromechanical devices. In this way, MEMS represents a complete system-on-a-chip, free of discrete, macro-scale, moving mechanical parts.

The development of MEMS components is growing due to their low cost, small area, and high performance. However, challenges remain in reducing the device footprint relative to the footprint achieved utilizing two-dimensional integration of integrated passive devices and MEMS components, reducing cost, and simplifying fabrication processes. Therefore, there is a tremendous need for more functional and cost-effective fabrication, packaging, and integration techniques for implementation of passive devices, reduction of capacitive coupling and RC losses between devices, and the incorporation of MEMS devices directly on or within integrated circuits.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

In one embodiment, an electronic device based upon a three-dimensional integrated passive device architecture includes an integrated passive device, for example, a metal-insulator-metal (MIM) capacitor. The electronic device based upon a three-dimensional integrated passive device architecture may be combined with a micro electro-mechanical systems (MEMS) component in a stacked fashion. The resulting combination can be readily and cost effectively incorporated into existing and upcoming MEMS-based systems. In another embodiment, the electronic device based upon a three-dimensional integrated passive device architecture may further be combined with an underpass transmission line that can be utilized in lieu of a low dielectric material or in lieu of an air bridge to reduce capacitive coupling and RC losses.

Figure 1:
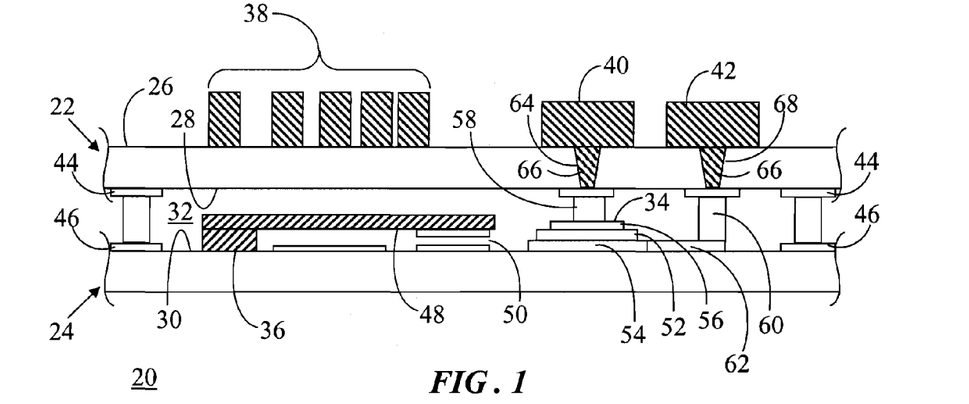
FIG. 1 shows a cross-sectional view of an electronic device in accordance with one embodiment of the present invention.

FIG. 1 shows a cross-sectional view of an electronic device 20 in accordance with one embodiment of the present invention. Electronic device 20 includes a substrate 22 and a substrate 24 coupled to substrate 22. Substrate 22 has a surface 26 and a surface 28. Similarly, substrate 24 includes a surface 30. Substrate 22 is coupled to substrate 24 such that surface 28 faces surface 30 to form a volume 32 between substrates 22 and 24.

In the embodiment of FIG. 1, an integrated device 34 is formed on surface 30 of substrate 24. In addition, a MEMS component 36 is formed on surface 30 of substrate 24. Integrated device 34 and MEMS component 36 are located within volume 32. Thus, substrate 22 serves as a lid for integrated device 34 and MEMS component 36. An integrated device 38 may be formed on surface 26 of substrate 22. Additionally, a terminal pad 40 and a terminal pad 42 may be formed on surface 26 of substrate 22.

As known to those skilled in the art, a substrate is typically a thin (approximately one half of a millimeter) disk that includes semiconductor material, such as silicon crystal, which contains a plurality of integrated circuits that form a uniform patchwork over a surface of the substrate, prior to their being cut free and packaged. The plurality of distinct integrated circuits are produced when cut or etched from the substrate, although these integrated circuits are not ready for use until packaged and provided with external connections. These distinct integrated circuits are typically referred to as chips or die. For purposes of the present invention, substrates 22 and 24 of electronic device 20 is that portion of a stacked configuration of semiconductor substrates populated by the integrated circuit that includes at least integrated devices 34 and 38, MEMS component 36, and terminal pads 40 and 42.

Coupling of substrate 22 with substrate 24 may be achieved through application of a bonding layer 44 on a bonding perimeter of surface 28 of substrate 22 and application of a bonding layer 46 on a corresponding bonding perimeter of surface 30 of substrate 24. Bonding layers 44 and 46 may be metallic bond rings that couple to one another to form a hermetically sealed joint surrounding volume 32. Bonding layers 44 and 46 can be a number of different materials typically used for creating the hermetically sealed joint. Such materials include, for example, gold, indium, aluminum, copper, silver, alloys thereof, and compounds thereof.

In this exemplary embodiment, MEMS component 36 is illustrated as a MEMS-based switch having a switch beam 48 formed on substrate 24 and switch contacts 50. Although a MEMS-based switch is illustrated, MEMS component 36 can be any of a variety of existing and upcoming MEMS components. It should be understood that the inclusion of only integrated device 34 and MEMS component 36 on substrate 24 is not a limitation of the present invention. Rather, substrate 24 may be further populated with mechanical elements, sensors, actuators, and electronics in accordance with a desired usage of electronic device 20.

In one embodiment, integrated devices 34 and 38 are integrated passive devices. A passive device is a device that does not require a source of energy for its operation. Examples of passive devices include resistors, capacitors, inductors, optical fibers, wires, filters, and so forth. Integrated passive devices can be used to effectively reduce component and module sizes. As used herein, an integrated passive device (IPD) is a passive electronic device or a passive electronic component that can be fabricated using semiconductor process technology. An IPD can be produced with very high precision, excellent reproducibility, and low cost in high quantities by utilizing semiconductor substrate processing technologies. The combination of substrates 22 and 24 with their associated integrated passive devices and with MEMS component 36 thus forms an IPD/MEMS stacked architecture that provides benefits including improved packing density, noise immunity, improved total power due to reduced wire length/lower capacitance, superior performance, and the ability to implement added functionality.

In a more particular embodiment, integrated device 34 is a metal-insulator-metal (MIM) capacitor. MIM capacitor 34 is a semiconductor device formed by sandwiching a thin layer of a dielectric material 52 between two layers of conductive material, usually metals. The metal layers are referred to herein as a bottom electrode 54 and a top electrode 56 of MIM capacitor 34. Bottom electrode 54 is electrically isolated from top electrode 56 due to dielectric material 52. For purposes of the following discussion, the term "bottom electrode" refers to that portion of MIM capacitor 34 that is in closest contact with the particular one of substrates 22 and 24 upon which MIM capacitor 34 is built. In this instance, bottom electrode 54 is in contact with surface 30 of substrate 24. In contrast, the term "top electrode" refers to that portion of MIM capacitor 34 that is farthest from the particular one of substrates 22 and 24 upon which MIM capacitor 34 is built.

A conductive element 58 extends or spans between top electrode 56 and surface 28 of substrate 22. In addition, a conductive element 60 extends generally between surface 30 of substrate 24 and surface 28 of substrate 22. Conductive element 60 is in electrical communication with bottom electrode 54 via a trace 62 formed on surface 30. Conductive elements 58 and 60 are electrically isolated from one another thereby maintaining electrical isolation between bottom and top electrodes 54 and 56. Conductive elements 58 and 60 are desirably formed of the same material utilized to form bonding layers 44 and 46 such as, gold, indium, aluminum, copper, silver, alloys thereof, and compounds thereof. As such, conductive elements 58 and 60 can be formed when bonding layers 44 and 46 are coupled to one another to form the hermetically sealed joint surrounding volume 32.

A via 64 extends between surfaces 26 and 28 of substrate 22. A conductive material 66 is positioned in via 64 to form an electrically conductive connection between surfaces 24 and 26. Via 64 is in electrical communication with conductive element 58 and is utilized to electrically interconnect conductive element 58, hence top electrode 56, with terminal pad 40. Similarly, a via 68 extends between surfaces 26 and 28 of substrate 22. Conductive material 66 is positioned in via 68 to form another electrically conductive connection between surfaces 24 and 26. Via 68 is in electrical communication with conductive element 60 and is utilized to electrically interconnect conductive element 60, hence bottom electrode 54, with terminal pad 42. Terminal pads 40 and 42 are electrically isolated from one another and provide locations for electrical connections between MIM capacitor 34 located within volume 32 and any other devices on surface 26 of substrate 22 or any other devices external to electronic device 20.

Figure 2:
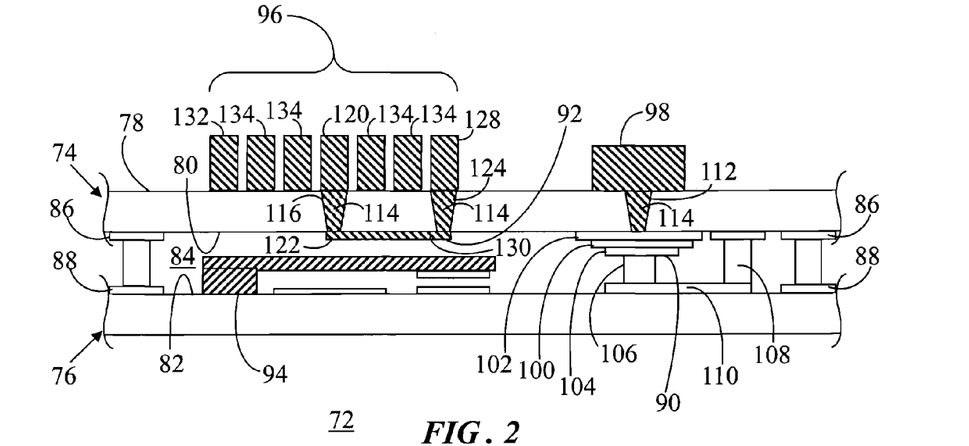
FIG. 2 shows a cross-sectional view of an electronic device in accordance with another embodiment of the present invention.

FIG. 2 shows a cross-sectional view of an electronic device 72 in accordance with another embodiment of the present invention. Electronic device 72 includes a substrate 74 and a substrate 76 coupled to substrate 74. Substrate 74 has a surface 78 and a surface 80. Similarly, substrate 76 includes a surface 82. Substrate 74 is coupled to substrate 76 such that surface 80 faces surface 82 to form a volume 84 between substrates 74 and 76. As discussed above, coupling of substrate 74 with substrate 76 may be achieved through application of a bonding layer 86 on a bonding perimeter of surface 80 of substrate 74 and application of a bonding layer 88 on a corresponding bonding perimeter of substrate 76.

In the embodiment of FIG. 2, an integrated device, in the form of a MIM capacitor 90 is formed on surface 80 of substrate 74. An underpass transmission line 92 (discussed below) is also formed on surface 80 of substrate 74. As in electronic device 20 (FIG. 1), a MEMS component 94 is formed on surface 82 of substrate 76. MIM capacitor 90, underpass transmission line 92, and MEMS component 94 are located within volume 84. That is, substrate 74 serves as a lid for substrate 76. An integrated device 96 and a terminal pad 98 are formed on surface 78 of substrate 74.

MIM capacitor 90, underpass transmission line 92, and integrated device 96 are integrated passive devices, and substrate 74 is a three-dimensional structure where three-dimensionality is achieved by fabrication of integrated device 96 on surface 78 of substrate 74 and fabrication of MIM capacitor 90 and underpass transmission line 92 on the opposing surface 76 of substrate 74. This three-dimensional integrated passive device architecture differs from conventional three-dimensional integrated circuits in which devices are fabricated in layers formed on only one side, or surface, of a substrate. Moreover, the combination of substrates 74 and 76 with their associated integrated passive devices and MEMS component 94 forms an IPD/MEMS stacked architecture to achieve improved packing density, noise immunity, improved total power due to reduced wire length/lower capacitance, superior performance, and the ability to implement added functionality.

MIM capacitor 90 includes a thin layer of a dielectric material 100 sandwiched between a bottom electrode 102 and a top electrode 104. Bottom electrode 102 is electrically isolated from top electrode 104 due to dielectric material 100. Again, the term "bottom electrode" refers to that portion of MIM capacitor 90 that is in closest contact with the particular one of substrates 74 and 76 upon which MIM capacitor 90 is built. In this instance, bottom electrode 102 is in closest contact with surface 80 of substrate 74.

A conductive element 106 extends or spans between top electrode 104 and surface 82 of substrate 76. In addition, a conductive element 108 extends generally between surface 82 of substrate 76 and surface 80 of substrate 74. Conductive element 108 is in electrical communication with top electrode 104 via a trace 110 formed on surface 82. Thus, conductive element 106, trace 110, and conductive element 108 form a signal path between top electrode 104 and surface 80 of substrate 74 that is electrically isolated from bottom electrode 102. Conductive elements 106 and 108 are desirably formed of the same material utilized to form bonding layers 86 and 88. As such, conductive elements 106 and 108 can be formed when bonding layers 86 and 88 are coupled to one another to form the hermetically sealed joint, or seal ring, surrounding volume 84.

A via 112 extends between surface 78 and surface 80 of substrate 74. A conductive material 114 is positioned in via 112 to form an electrically conductive connection between surfaces 78 and 80. Via 112 is in electrical communication with bottom electrode 102 and is utilized to electrically interconnect bottom electrode 102 with terminal pad 98. Substrate 74 does not include another via in electrical communication with conductive element 108, hence top electrode 104, to demonstrate that signal paths for top electrode 104 and/or bottom electrode 102 need not necessarily extend through substrate 74, but may instead interconnect with another component (not shown) located within volume 84. Similarly, in another embodiment, conductive element 108 need not be present if a signal path for top electrode interconnects with another component located on surface 82 of substrate 76 within volume 84.

A via 116 extends between surfaces 78 and 80 of substrate 74. Conductive material 114 is positioned in via 116 to form an electrically conductive connection between surfaces 78 and 80. Via 116 is in electrical communication with a node 120 of integrated device 96 located on surface 78 of substrate 74. Underpass transmission line 92 has an end 122 electrically coupled with via 116. A via 124 also extends between surfaces 78 and 80 of substrate 74, and conductive material 114 is positioned in via 124 to form an electrically conductive connection between surfaces 78 and 80. Via 124 is in electrical communication with a terminal pad 128 formed on surface 78 of substrate 74. Via 124 is electrically coupled with an end 130 of underpass transmission line 92.

Figure 3:
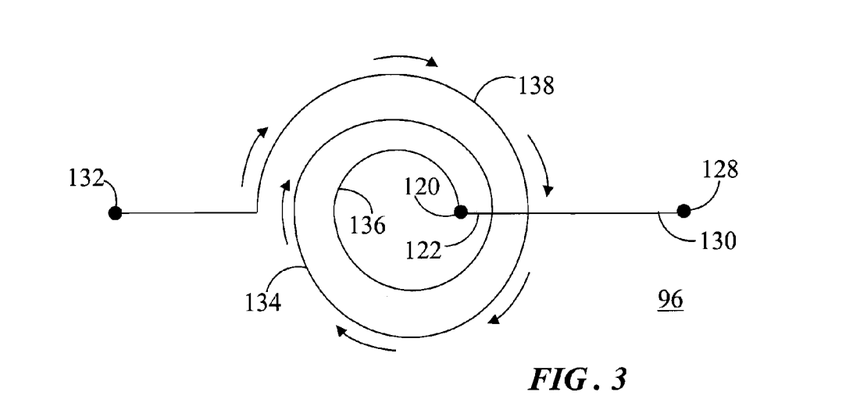
FIG. 3 shows a schematic representation of a portion of the electronic device of FIG. 2.

Referring to FIG. 3 in connection with FIG. 2, FIG. 3 shows a schematic representation of a portion of integrated device 96 of electronic device 72. Integrated device 96 may include a radio frequency (RF) circuit, for example, an RF harmonic filter. In general, an RF signal enters integrated device 96 at an input terminal 132, and a filtered RF signal within the desired RF band is provided at terminal pad 128. The RF energy propagates over conductive traces formed on surface 78 of substrate 74. Harmonic content associated with the RF input signal is typically rejected by at least one harmonic resonance circuit that may be realized as an RF inductor 134 in parallel with a capacitor (not shown). Inductor 134 may be realized, for example, as a spiral-shaped conductive RF signal line loop, as shown in FIG. 3 that defines a signal path. Node 120 is located proximate an innermost turn 136 of inductor 134. Arrows flowing around RF inductor 134 represent the inductor current vectors.

Air bridges are typically employed at the "intersections" of the inductor to insulate the inductor loops from the transmission lines. In accordance with the present invention, the air bridges of prior art structures are replaced by underpass transmission line 92 to convey the RF signal from node 120 to terminal pad 128. To that end, underpass transmission line 92 is formed to extend beyond an outermost turn 138 of inductor 134. The utilization of underpass transmission line 92 located on surface 80 of substrate 74 with inductor 134 being located on surface 78 of substrate 74 functions to reduce parasitic capacitance of underpass transmission line 92 without using more complex, costly, and/or larger air bridges or thick polymer coating processes. Although underpass transmission line 92 is only shown in connection with electronic device 72, it should be understood that underpass transmission line 92 can be readily implemented in electronic device 20 (FIG. 1) underlying and interconnecting portions of integrated device 38 (FIG. 1).

Figure 4:
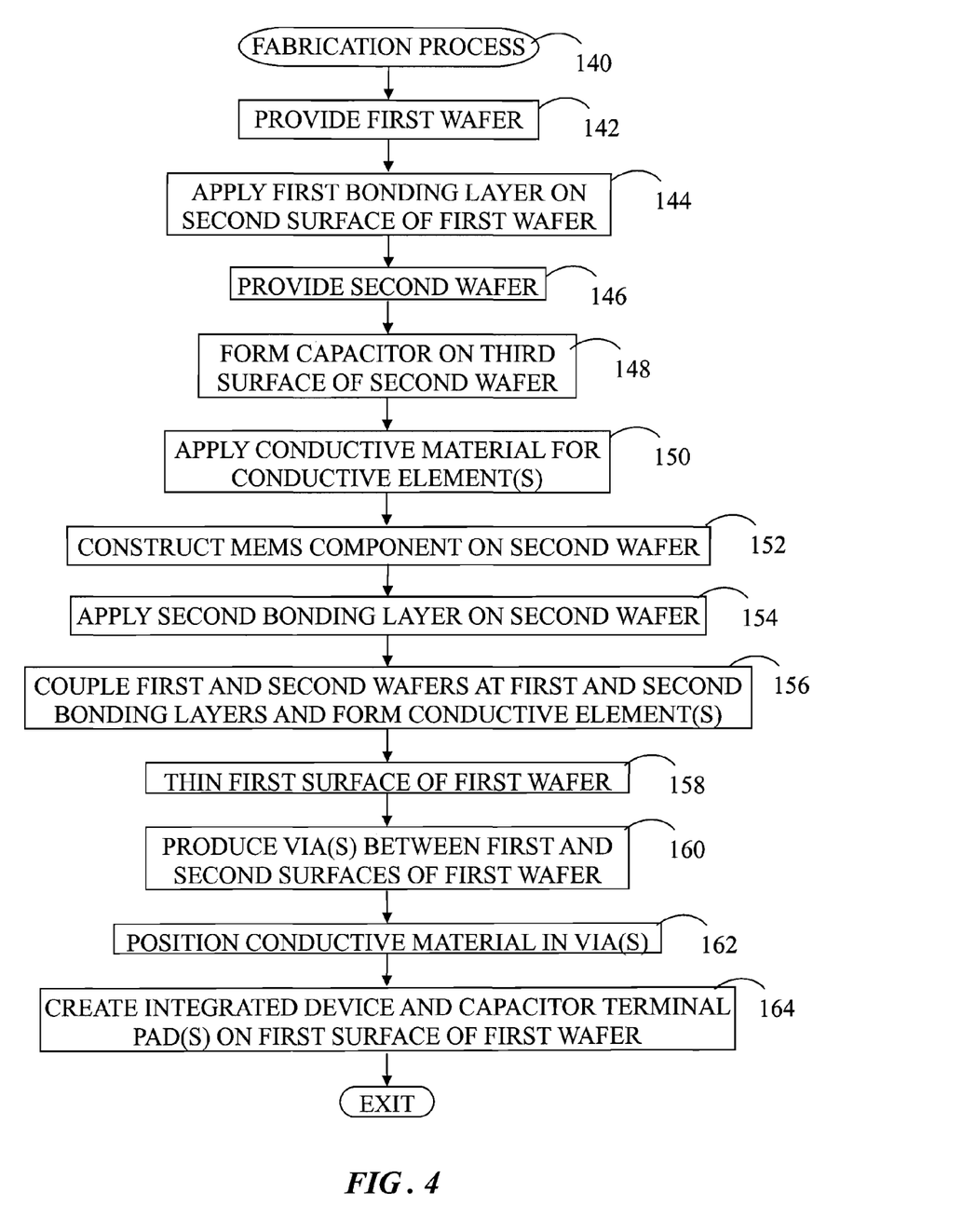
FIG. 4 shows a flowchart of a fabrication process for fabricating the electronic device of FIG. 1.

FIG. 4 shows a flowchart of a fabrication process 140 for fabricating electronic device 20 (FIG. 1). Since fabrication process 140 describes methodology for fabricating the stacked architecture of electronic device 20, reference should be made to FIG. 1 in order to visualize the elements of device 20 discussed in connection with the ensuing methodology. The fabrication of electronic device 72 (FIG. 2) deviates slightly from process 140. Accordingly, a fabrication process particular to the configuration of electronic device 72 will be discussed in connection with FIG. 5.

MEMS devices, such as MEMS component 36 (FIG. 1), typically require a cavity package with a lid. Fabrication process 140 describes a cavity packaging technique in which substrate 22 of electronic device 20 is utilized as a lid or cap for MEMS component 36 constructed on substrate 24. The stacking of substrates 22 and 24 utilizing substrate 22 as the lid makes the finished electronic device 20 more compact and more cost effective then two-dimensional architectures. Fabrication process 140 is described below in connection with the fabrication of a single electronic device 20. However, it should be understood by those skilled in the art that the following process allows for concurrent substrate-level manufacturing of a plurality of electronic devices 20 at a time. The individual packaged devices 20 can then be cut, or diced, in a conventional manner to provide individual electronic devices 20 that are hermetically packaged.

Fabrication process 140 begins with a task 142. At task 142, substrate 22 is provided. In one embodiment, substrate 22 may be fabricated from a pure semiconducting material grown into mono-crystalline cylindrical ingots up to approximately thirty-one centimeters in diameter utilizing conventional processes and is typically provided in thin wafers approximately one half to three quarters of a millimeter thick. However, known wafers having different dimensions may be utilized in other embodiments. These thin wafers are polished to obtain a very regular and flat surface. Silicon is the most commonly used semiconductor material in use, along with gallium arsenide, germanium, and some other materials. In other embodiments, wafers of configurations other than pure semiconducting material may be fabricated, e.g., a silicon-on-insulator configuration.

Next, a task 144 is performed. At task 144, bonding layer 44 is applied on a bonding perimeter of surface 28 of substrate 22. As will be discussed in connection with FIG. 5, structures may be formed on surface 28 of substrate 22 using one or more metal layers and dielectric layers. The formation of any structures prior to coupling substrates 22 and 24 of electronic device 20 reduces the number of process steps required following the coupling of substrates 22 and 24. As a result, the associated potential for device damage and/or degradation due to high temperature processing is reduced.

Following task 144, a task 146 is performed. At task 146, substrate 24 is provided. Substrate 24 is manufactured in much the same manner as that described in connection with task 142.

Fabrication process 140 continues with a task 148. At task 148, the integrated device, in this example, MIM capacitor 34, is formed on surface 30 of substrate 24 using a semiconductor process technology. In accordance with known semiconductor fabrication techniques, MIM capacitor 34 and other structures may be formed on surface 30 of substrate 24 using one or more metal layers and dielectric layers to form dielectric material layer 52, bottom electrode 54, and top electrode 56. Performing task 148 prior to coupling substrates 22 and 24 of electronic device 20 eliminates the use of high process temperature following the coupling of substrates 22 and 24. As a result, the associated potential for device damage and/or degradation due to high temperature processing is reduced.

Following task 148, a task 150 is performed. At task 150, conductive material for conductive elements 58 and 60 is applied onto top electrode 56 and onto surface 30 of substrate 24 at the appropriate locations. It should be noted that in an alternative methodology, the conductive material used to form conductive elements 58 and 60 may be applied onto surface 28 of substrate 22 concurrent with the application of bonding layer 44 at task 144. In another alternative methodology, the conductive material used to form conductive elements 58 and 60 may be applied onto surface 30 of substrate 24 concurrent with the application of bonding layer 46, discussed below.

Fabrication process 140 continues with a task 152. At task 152, MEMS component 36 is constructed on surface 30 of substrate 24 in accordance with known MEMS fabrication processes. These MEMS fabrication processes include, for example, deposition processes, photolithography, wet and dry etching processes, and bulk micromachining. Although capacitor formation task 148 and MEMS component fabrication task 150 are described as serial operations, it should be understood that these fabrication tasks can be performed concurrently for efficiency and cost savings.

Following task 152, a task 154 is performed. At task 154, bonding layer 46 is applied to a bonding perimeter of substrate 24. Bonding layers 44 and 46 may be chosen to achieve effective alloy bonding at a temperature less than that of other metals or elements of MIM capacitor 34 and MEMS component 36.

It should be noted that tasks 142 and 144 pertain to the fabrication of substrate 22 and tasks 146, 148, 150, 152, and 154 pertain to the fabrication of substrate 24. Accordingly, although they are described herein as being serial operations for simplicity, these distinct groups of operations may be performed in parallel in separate areas of a single manufacturing facility or these distinct groups of operations may be performed at different manufacturing facilities.

Fabrication process 140 continues with a task 156. At task 156, substrates 22 and 24 are coupled at bonding layers 44 and 46 to form a seal ring about MEMS component 36 and MIM capacitor 34. Coupling may occur by heating substrates 22 and 24 to achieve effective alloy bonding.

Following task 156, a task 158 is performed. At task 158, surface 26 of substrate 22 is thinned. Thinning entails the reduction of the thickness of substrate 22 on surface 26 by a process such as grinding or lapping and polishing. Thinning of substrate 22 is performed in order to enable a reasonable through-substrate-via process. Handling a thinned substrate is typically performed by attaching it to a carrier substrate. However, since substrates 22 and 24 were coupled at task 156, substrate 24 can conveniently and cost effectively serve as the carrier substrate for the thinned substrate 22.

Next, a task 160 is performed. At task 160, vias 64 and 68 are produced between surfaces 28 and 30 of substrate 22. Conventional photolithographic methods may be employed to form vias 64 and 68.

A task 162 is performed in connection with task 160. At task 162, conductive material 66 is positioned in vias 64 and 68. The conductive material may be, for example, copper, gold, aluminum, alloys of copper, alloys of gold, and the like. As known to those skilled in the art, vias 64 and 68 need not be completely filled with conductive material. Rather, vias 64 and 68 can be partially filled as long as electrical contact can be made from surface 26 (FIG. 1) to surface 28 (FIG. 1) of substrate 22.

Following task 162, a task 164 is performed. At task 164, integrated device 38 and terminal pads 40 and 42 are created on surface 26 of substrate 22 using a semiconductor process technology. In accordance with known semiconductor fabrication techniques, integrated device 38, terminal pads 40 and 42, and other elements of the electronic device 20 may be formed on surface 26 of substrate 22 using one or more metal layers and dielectric layers. Following task 164, fabrication process 140 is complete and the process exits. Of course, subsequent known processes may be performed following task 164 such as, for example, a die singulation process to form the separate integrated circuits, i.e., electronic devices 20.

Integrated device 38 and terminal pads 40 and 42 are created on surface 26 of substrate 22 at task 164 following substrate coupling task 156 because the conductive traces of integrated device 38 and/or terminal pads 40 and 42 may be necessarily thick to achieve high quality signals. If the thick metal elements were created on surface 26 prior to substrate coupling in electronic device 20, then formation of the thick metal pattern could possibly interfere with the bonding gap control and MEMS component 36 (FIG. 1). In addition, the same fabrication process step 164 for creation of integrated device 38 and terminal pads 40 and 42 enhances fabrication efficiency. Moreover, the formation of MIM capacitor 34 and MEMS component 36 on surface 30 of substrate 24 at the earlier tasks 148 and 152 and then the subsequent creation of integrated device 38 and terminal pads 40 and 42 on surface 26 of substrate 22 at task 164 following substrate coupling task 156 may eliminate the need for the potentially damaging high temperature thin film deposition processing of the prior art.

Figure 5:
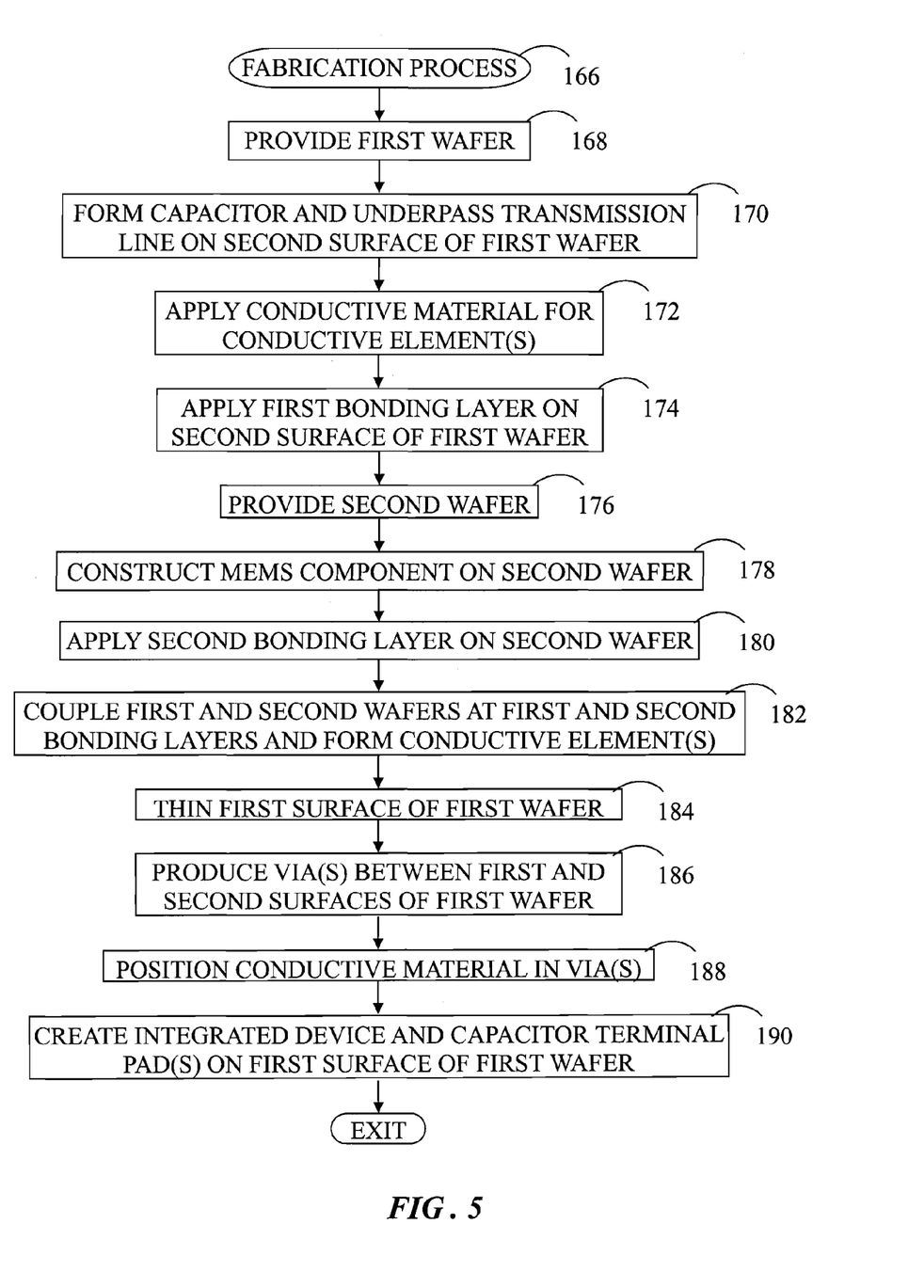
FIG. 5 shows a flowchart of a fabrication process for fabricating the electronic device of FIG. 2.

FIG. 5 shows a flowchart of a fabrication process 166 for fabricating electronic device 72 (FIG. 2). Like fabrication process 140, fabrication process 166 is described below in connection with the fabrication of a single electronic device 72 for clarity of description. However, those skilled in the art will understand that the following process allows for concurrent wafer-level manufacturing of a plurality of electronic devices 72 at a time. The individual packaged devices 72 can then be cut, or diced, in a conventional manner to provide individual electronic devices 72 that are hermetically packaged. In addition, since fabrication process 166 describes methodology for fabricating the stacked architecture of electronic device 72, reference should be made to FIG. 2 in order to visualize the elements of device 72 discussed in the ensuing methodology.

Fabrication process 166 begins with a task 168. At task 168, substrate 74 is provided. Substrate 74 is manufactured in much the same manner as that described above in connection with task 142 (FIG. 4).

Following task 168, a task 170 is performed. At task 170, the integrated device, in this example, MIM capacitor 90, and underpass transmission line 92 are formed on surface 80 of substrate 74 using a semiconductor process technology. In accordance with known semiconductor fabrication techniques, MIM capacitor 90, underpass transmission line 92, and other structures may be formed on surface 80 of substrate 74 using one or more metal layers and dielectric layers to produce the structure depicted in FIG. 2. Again, performing task 170 prior to coupling substrates 74 and 76 of electronic device 72 reduces the number of process steps required following the coupling of substrates 74 and 76, thereby reducing associated potential for device damage and/or degradation due to high temperature processing.

Following task 170, a task 172 is performed. At task 172, conductive material for conductive elements 106 and 108 is applied onto top electrode 104 and onto surface 80 of substrate 74 at the appropriate locations.

A task 174 may be performed concurrent with task 172. At task 174, bonding layer 86 is also applied on a bonding perimeter of surface 80 of substrate 74. As noted above, the conductive material used to form conductive elements 106 and 108 may be the same as that used for bonding layer 86. Accordingly, it may be more time and cost effective to perform tasks 172 and 174 simultaneously.

Following tasks 172 and 174, a task 176 is performed. At task 176, substrate 76 is provided. Substrate 76 is manufactured in much the same manner as that described above in connection with task 142 (FIG. 4).

Fabrication process 166 continues with a task 178. At task 178, MEMS component 94 is constructed on surface 82 of substrate 76 in accordance with known MEMS fabrication processes. These MEMS fabrication processes include, for example, deposition processes, photolithography, wet and dry etching processes, and bulk micromachining.

Following task 178, a task 180 is performed. At task 180, bonding layer 88 is applied to a bonding perimeter of substrate 76. Bonding layers 86 and 88 may be chosen to achieve effective alloy bonding at a temperature less than that of other metals or elements of MIM capacitor 90 and MEMS component 94.

Fabrication process 166 continues with a task 182. At task 182, substrates 74 and 76 are coupled at bonding layers 86 and 88. Coupling may occur by heating substrates 74 and 76 to achieve effective alloy bonding.

Following task 182, a task 184 is performed. At task 184, surface 78 of substrate 74 is thinned as discussed above in connection with task 158 (FIG. 4).

Next, a task 186 is performed. At task 186, vias 112, 116, and 124 are produced between surfaces 78 and 80 of substrate 74. Conventional photolithographic methods may be employed to form vias 112, 116, and 124.

A task 188 is performed in connection with task 186. At task 188, conductive material 114 is positioned in vias 112, 116, and 124, as described above in connection with task 162 (FIG. 4).

Following task 188, a task 190 is performed. At task 190, integrated device 96 and terminal pad 98 are created on surface 78 of substrate 74 using a semiconductor process technology. In accordance with known semiconductor fabrication techniques, integrated device 96, terminal pad 98, and other elements of electronic device 72 may be formed on surface 78 of substrate 74 using one or more metal layers and dielectric layers. Following task 190, fabrication process 166 is complete and the process exits. Of course, known processes may be performed following task 190 such as, for example, a die singulation process to form the separate integrated circuits, i.e., electronic devices 72.

Like electronic device 20 (FIG. 1), integrated device 96, terminal pad 98, and other elements of electronic device 72 are created on surface 78 of substrate 74 following substrate coupling task 182 because the conductive traces of integrated device 96 and/or terminal pad 98 may be necessarily thick to achieve high quality signals. If the thick metal elements were created on surface 78 prior to substrate coupling of electronic device 72, then formation of the thick metal pattern could possibly interfere with the bonding gap control and MEMS component 94. In addition, the same fabrication process step 190 for creation of integrated device 96 and terminal pad 98 enhances fabrication efficiency. Moreover, the formation of transmission underpass line 92, MIM capacitor 90, and MEMS component 94 at the earlier tasks 170 and 178 and then the subsequent creation of integrated device 96 and terminal pad 98 following substrate coupling task 182 may eliminate the need for the potentially damaging high temperature thin film deposition processing of the prior art.

An embodiment described herein comprises an electronic device that includes two substrates in a three-dimensional stacked configuration. The two substrates are coupled to form a hermetically sealed volume between the substrates. An integrated passive device, in the form of a metal-insulator-metal (MIM) capacitor, and a micro electro-mechanical component are formed on surfaces of the substrates within the volume. A conductive element component is utilized with the MIM capacitor in lieu of a conventional air bridge to mitigate the problem of capacitive coupling and RC losses. An integrated passive device may be created on an outer surface of one of the substrates and an underpass transmission line may be created on an opposing surface of the substrate within the volume. The underpass transmission line electrically interconnects one portion of the integrated passive device with another portion of the same integrated device by way of vias formed through the substrate. Utilization of the underpass transmission line formed on the opposing surface of the substrate again reduces capacitive coupling and RC losses without the need for the more complex, hence costly, air bridge architecture of prior art designs. The stacked configuration of electronic devices described herein and the use of conductive elements and a transmission underpass line provide benefits including improved packing density, noise immunity, improved total power due to reduced wire length/lower capacitance, superior performance, and the ability to implement added functionality.

Another embodiment comprises methodology for fabricating an electronic device having a MIM capacitor and MEMS component in a three-dimensional, stacked architecture. The fabrication methodology for the electronic device simplifies the overall process, improves yield, and reduces manufacturing costs. In particular, the process flow is simplified by maximizing the utilization of existing processing steps and carrying out several of the processing steps before the substrates are bonded and thinned.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A device comprising:
a first substrate having a first surface and a second surface opposing said first surface;
a second substrate coupled to said first substrate to form a volume between said first and second substrates, said second substrate having a third surface facing said second surface of said first substrate;
an integrated device formed on a first one of said second and said third surfaces within said volume, said integrated device including a top electrode and a bottom electrode; and
a conductive element spanning between said top electrode of said integrated device and a second one of said second and said third surfaces, said conductive element being in continuous contact with both of said top electrode and said second one of said second and third surfaces.

2. A device as claimed in claim 1 further comprising:
a conductively filled via extending between said first and second surfaces of said first substrate, said via being in electrical communication with said conductive element; and
a terminal pad formed on said first surface and electrically coupled with said via.

3. A device as claimed in claim 2 wherein said via is a first via, said terminal pad is a first terminal pad, and said device further comprises:
a second conductively filled via extending between said first and second surfaces of said first substrate, said second via being in electrical communication with said bottom electrode of said integrated device; and
a second terminal pad formed on said first surface and electrically coupled with said second via, said second terminal pad being electrically isolated from said first terminal pad.

4. A device as claimed in claim 1 wherein:
said conductive element is a first conductive element spanning between said top electrode and said second surface when said first one of said second and third surfaces is said third surface of said second substrate;
said bottom electrode is formed on said third surface of said second substrate; and
said device comprises a second conductive element extending from said bottom electrode to said second surface of said first substrate, said second conductive element being electrically isolated from said first conductive element.

5. A device as claimed in claim 1 wherein:
said conductive element is a first conductive element spanning between said top electrode and said third surface when said first one of said second and third surfaces is said second surface of said first substrate;
said bottom electrode is formed on said second surface of said first substrate; and
said device further comprises a second conductive element extending between said third surface of said second substrate and said second surface of said first substrate, said second conductive element being in electrical communication with said first conductive element.

6. A device as claimed in claim 1 wherein said integrated device comprises a metal-insulator-metal (MIM) capacitor having said top electrode in electrical communication with said conductive element and said bottom electrode electrically isolated from said conductive element.

7. A device as claimed in claim 1 further comprising a second integrated device formed on said first surface of said first substrate.

8. A device as claimed in claim 7 wherein:
said second integrated device includes a conductive path having a node surrounded by said conductive path; and
said device further comprises:
a first conductively filled via extending between said first and second surfaces of said first substrate, said first via being in electrical communication with said node;
an underpass transmission line formed on said second surface of said first substrate and located within said volume, said underpass transmission line having a first end electrically coupled with said first via and having a second end;
a second conductively filled via extending between said first and second surfaces of said first substrate, said second via being electrically coupled with said second end; and
a terminal pad formed on said first surface of said first substrate and electrically coupled with said second via.

9. A device as claimed in claim 8 wherein said conductive path comprises a spiral-shaped conductor defining a signal path, said node is located proximate an innermost turn of said conductive path, and said underpass transmission line is formed to extend beyond an outermost turn of said conductive path.

10. A device as claimed in claim 1 further comprising a micro electro-mechanical systems (MEMS) component formed on said third surface of said second substrate and located within said volume.

11. A device as claimed in claim 10 further comprising a seal ring extending between said first and second substrates and surrounding said MEMS component and said integrated device, said seal ring and said conductive element being fabricated concurrently from a conductive material.

12. A device comprising:
a first substrate having a first surface and a second surface opposing said first surface;
a second substrate coupled to said first substrate to form a volume between said first and second substrates, said second substrate having a third surface facing said second surface of said first substrate;
a capacitor formed on a first one of said second and said third surfaces within said volume, said capacitor including a bottom electrode and a top electrode;
a first conductive element spanning between said top electrode and a second one of said second and said third surfaces, said first conductive element being in continuous contact with both of said top electrode and said second one of said second and third surfaces; and
a second conductive element spanning between said second and said third surfaces, said second conductive element being in electrical communication with one of said bottom electrode and said first conductive element.

13. A device as claimed in claim 12 further comprising:
a first conductively filled via extending between said first and second surfaces of said first substrate, said first via being in electrical communication with a first one of said bottom electrode and said top electrode;
a first terminal pad formed on said first surface and electrically coupled with said first via;
a second conductively filled via extending between said first and second surfaces of said first substrate, said second via being in electrical communication with a second one of said bottom electrode and said top electrode; and
a second terminal pad formed on said first surface and electrically coupled with said via.

14. A device as claimed in claim 12 further comprising:
an integrated device formed on said first surface of said first substrate, said integrated device including a conductive path having a node surrounded by said conductive path;
a first conductively filled via extending between said first and second surfaces of said first substrate, said first via being in electrical communication with said node;
an underpass transmission line formed on said second surface of said first substrate and having a first end electrically coupled with said first via and having a second end;
a second conductively filled via extending between said first and second surfaces of said first substrate, said second via being electrically coupled with said second end; and
a terminal pad formed on said first surface of said first substrate and electrically coupled with said second via.

15. A device as claimed in claim 14 further comprising a micro electro-mechanical systems (MEMS) component formed on said third surface of said second substrate and located within said volume.

* * * * *